United States Patent
Chandrasekhar et al.

(10) Patent No.: US 9,229,801 B2
(45) Date of Patent: Jan. 5, 2016

(54) METHOD AND DEVICE FOR WRITE ABORT PROTECTION

(71) Applicant: SANDISK TECHNOLOGIES INC., Plano, TX (US)

(72) Inventors: Uday Chandrasekhar, San Jose, CA (US); Jianmin Huang, San Carlos, CA (US); Steven Sprouse, San Jose, CA (US); Nian Niles Yang, Mountain View, CA (US); Xinde Hu, San Diego, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/035,529

(22) Filed: Sep. 24, 2013

(65) Prior Publication Data

US 2015/0089324 A1 Mar. 26, 2015

(51) Int. Cl.

| | |
|---|---|
| *G11C 29/00* | (2006.01) |
| *G06F 11/10* | (2006.01) |
| *H03M 13/11* | (2006.01) |
| *H03M 13/29* | (2006.01) |
| *G11C 11/56* | (2006.01) |
| *G11C 16/22* | (2006.01) |
| *H03M 13/09* | (2006.01) |
| *H03M 13/15* | (2006.01) |

(52) U.S. Cl.
CPC ............ *G06F 11/10* (2013.01); *G06F 11/1072* (2013.01); *G11C 11/5628* (2013.01); *G11C 16/22* (2013.01); *G11C 29/78* (2013.01); *H03M 13/11* (2013.01); *H03M 13/2906* (2013.01); *H03M 13/2927* (2013.01); *H03M 13/098* (2013.01); *H03M 13/1102* (2013.01); *H03M 13/152* (2013.01); *H03M 13/1515* (2013.01); *H03M 13/2957* (2013.01)

(58) Field of Classification Search
None
See application file for complete search history.

(56) References Cited

U.S. PATENT DOCUMENTS

| | | | |
|---|---|---|---|
| 2007/0050579 A1* | 3/2007 | Hall et al. | 711/163 |
| 2010/0011153 A1 | 1/2010 | Yeh | |
| 2010/0262755 A1* | 10/2010 | Becker et al. | 711/103 |
| 2010/0332729 A1* | 12/2010 | Alrod et al. | 711/103 |

(Continued)

FOREIGN PATENT DOCUMENTS

WO 2011025536 A1 3/2011

OTHER PUBLICATIONS

Non-Final Office Action mailed Dec. 26, 2014 in U.S. Appl. No. 14/288,604, 10 pages.

(Continued)

*Primary Examiner* — Daniel McMahon
(74) *Attorney, Agent, or Firm* — Toler Law Group, PC

(57) ABSTRACT

A data storage device includes a non-volatile memory and a controller. A method includes receiving first data and second data from a host device. A first error-correcting code (ECC) codeword associated with the first data is written to a first word line of the non-volatile memory, and a second ECC codeword associated with the second data is written to a second word line of the non-volatile memory. The first ECC codeword includes a first bit and a second bit, and the second ECC codeword includes a third bit and a fourth bit. The method further includes writing parity information to a parity storage portion of the non-volatile memory that is distinct from the first word line and from the second word line. The parity information includes a parity bit that is based on the first bit, the second bit, the third bit, and the fourth bit.

20 Claims, 8 Drawing Sheets

(56) References Cited

U.S. PATENT DOCUMENTS

| | | |
|---|---|---|
| 2011/0029718 A1 | 2/2011 | Frickey, III et al. |
| 2012/0054582 A1 | 3/2012 | Byom et al. |
| 2012/0311406 A1* | 12/2012 | Ratnam et al. ............ 714/768 |
| 2013/0024748 A1* | 1/2013 | Sharon et al. ............ 714/773 |
| 2013/0031429 A1 | 1/2013 | Sharon et al. |
| 2013/0031440 A1* | 1/2013 | Sharon et al. ............ 714/758 |
| 2014/0245098 A1* | 8/2014 | Sharon et al. ............ 714/755 |
| 2014/0247655 A1* | 9/2014 | Motwani ............ 365/185.03 |
| 2014/0281814 A1* | 9/2014 | Vogan et al. ............ 714/766 |

OTHER PUBLICATIONS

Notice of Allowance and Fee(s) Due mailed Apr. 16, 2015 in U.S. Appl. No. 14/288,604, 5 pages.

* cited by examiner

METHOD AND DEVICE FOR WRITE ABORT PROTECTION

FIELD OF THE DISCLOSURE

The present disclosure is generally related to programming of data storage devices.

BACKGROUND

Non-volatile data storage devices, such as embedded memory devices and removable memory devices, have enabled increased portability of data and software applications. For example, multi-level cell (MLC) flash memory devices may store multiple bits in each flash memory cell, enhancing data storage density. Data stored at such devices may be encoded using error correcting coding (ECC) techniques that protect the data from errors associated with power supply noise, temperature variations, and other causes of data corruption. In some cases, the ECC techniques may be insufficient to recover corrupted data. For example, some data storage devices sequentially store bits of data by first writing "lower page" data (e.g., a "0" bit in a "10" number) to a storage element and subsequently writing "upper page" data (e.g., a "1" bit in a "10" number) to the storage element. If a write abort event occurs after writing the lower page data and while writing the upper page data, the lower page data may be corrupted. For example, after occurrence of the write abort event, a threshold voltage representing a particular bit of the data may fall between a first threshold voltage range associated with "0" bits and a second threshold voltage range associated with "1" bits. Further, the corruption of many such bits may exceed an ECC capability associated with the particular ECC technique used to encode the data, causing data loss.

SUMMARY

Techniques are disclosed to recover corrupted lower page data while also reducing an amount of data that is "backed up" for data recovery. To illustrate, certain conventional devices back up each bit of lower page data prior to writing upper page data. If a write abort event occurs while writing the upper page data, corrupted bits of the lower page data can be recovered from the backed up data. However, such a technique may utilize a large amount of memory and processing resources to back up the lower page data, reducing system performance. Other techniques may shift bits of the lower page data to an "intermediate" distribution prior to writing the upper page data. For example, an "LMB" technique may shift lower page data (an "LM" state) to a "B" state prior to initiating writing upper page data to reduce or eliminate overlap between an "A" state and the "LM" state in case of a write abort event. A "BC first" (BCF) technique may program "B" states and "C" states prior to programming "A" states, reducing or avoiding data loss caused by overlap of "A" states and "LM" states due to a write abort event. Such techniques may enable data recovery in case of a write abort event, but may be associated with increased bit error rates and/or performance degradation, depending on the particular application.

A write abort recovery technique in accordance with the present disclosure may use both reliable and unreliable bits of a page that has been corrupted by a write abort event to recover data, since the corrupted page typically stores uncorrupted data as well as corrupted data. As a particular example, first lower page data may be written to a first word line of a non-volatile memory. Second lower page data may be written to a second word line of the non-volatile memory after writing the first lower page data. Parity information may be generated based on bits of both the first lower page data and the second lower page data, such as by performing exclusive-or (XOR) operations between bits of the first lower page data and the second lower page data.

If a write abort event occurs while writing upper page data to the first word line or the second word line, certain bits of the lower page data may be corrupted. In a particular example, a corrupted bit is recovered using the parity information and another bit (e.g., an uncorrupted bit) of the first lower page data or the second lower page data. Because an uncorrupted bit of the lower page data is used to recover a corrupted bit of the lower page data, an amount of backup data for write abort recovery is reduced as compared to certain conventional devices that recover bits using only backup data.

DETAILED DESCRIPTION

Figure 1:
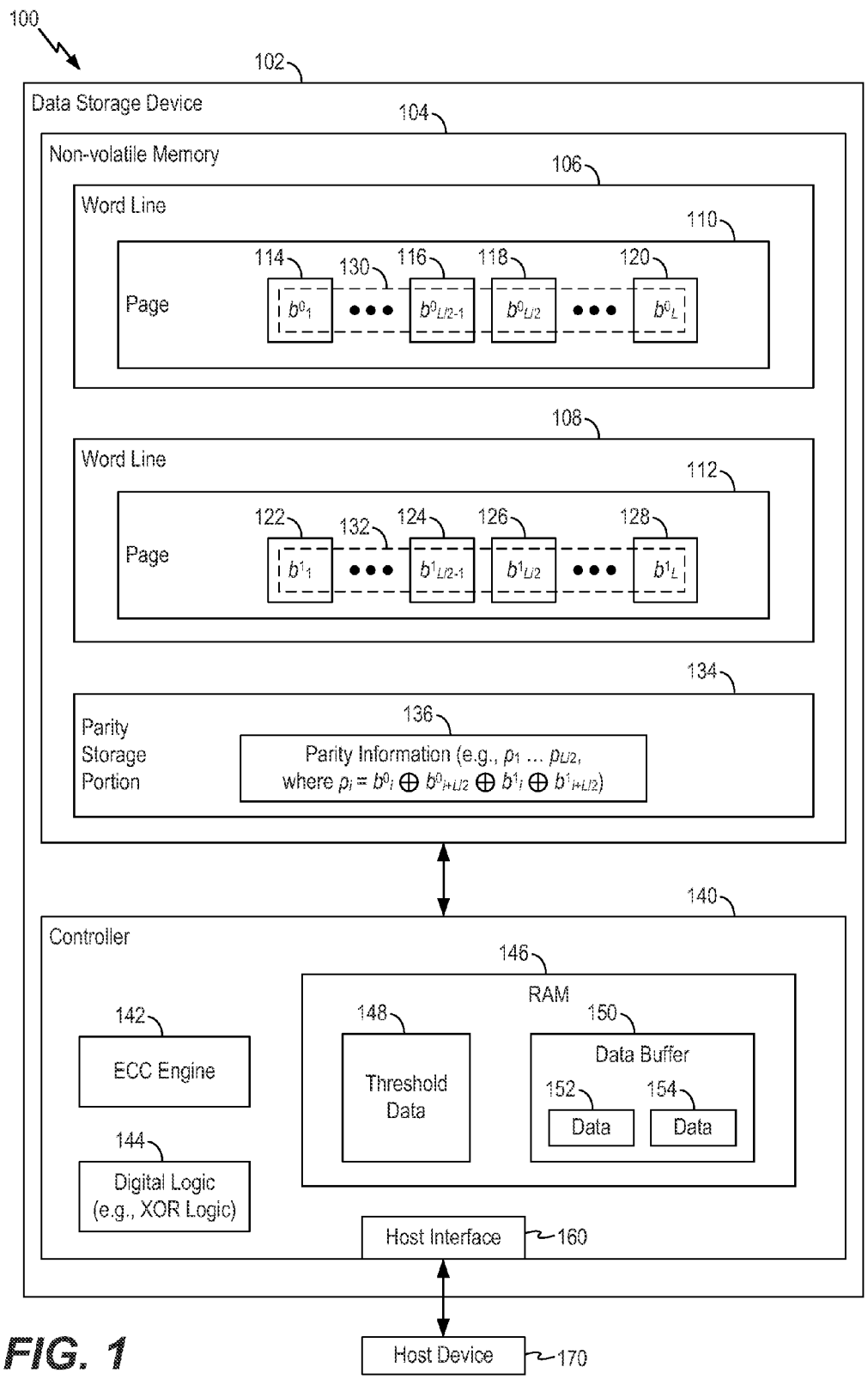
FIG. 1 is a block diagram of a particular illustrative embodiment of a system including a data storage device configured to recover data corrupted by a write abort event.

FIG. 1 is a block diagram of a particular illustrative embodiment of a system 100 including a data storage device 102 configured to recover data corrupted by a write abort event. The system 100 further includes a host device 170. The data storage device 102 may be embedded within the host device 170, such as in accordance with an embedded MultiMedia Card (eMMC) configuration. Alternatively, the data storage device 102 may be removably coupled to the host device 170. For example, the data storage device 102 may be removably coupled to the host device 170 in accordance with a removable universal serial bus (USB) configuration.

To further illustrate, the data storage device 102 may be configured to be coupled to the host device 170 as embedded memory, such as in connection with eMMC® (trademark of JEDEC Solid State Technology Association, Arlington, Va.) and eSD configurations, as illustrative examples. To illustrate, the data storage device 102 may correspond to an eMMC device. As another example, the data storage device 102 may correspond to a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The data storage device 102 includes a non-volatile memory 104 and a controller 140. In a particular illustrative embodiment, the non-volatile memory 104 may include a flash memory (e.g., a NAND flash memory or a NOR flash memory). In other implementations, the non-volatile memory 104 may include an erasable programmable read-only memory (EPROM), an electrically-erasable programmable read-only memory (EEPROM), a read-only memory (ROM), a one-time programmable memory (OTP), another type of memory, or a combination thereof. The non-volatile memory 104 and the controller 140 may be coupled via a bus, an interface, or other structure.

The non-volatile memory 104 may include multiple word lines. In the example of FIG. 1, the non-volatile memory 104 includes a word line 106 and a word line 108. The non-volatile memory 104 further includes a parity storage portion, such as a parity storage portion 134. In a particular embodiment, the parity storage portion 134 corresponds to a highly reliable storage portion (e.g., a "safezone") of the non-volatile memory 104, such as a single-level cell (SLC) storage portion. The word lines 106, 108 may correspond to a multi-level cell (MLC) storage portion of the non-volatile memory 104.

Each of the word lines 106, 108 may include one or more pages. In the example of FIG. 1, the word line 106 includes a page 110 and the word line 108 includes a page 112. Each of the pages 110, 112 may include one or more storage elements (e.g., one or more multi-level cells). In the particular example of the FIG. 1, the page 110 includes storage elements 114, 116, 118, 120, and the page 112 includes storage elements 122, 124, 126, 128. In a particular embodiment, each of the pages 110, 112 includes L storage elements, as depicted in the example of FIG. 1. L indicates an integer that is greater than one. For example, L may be 512, 1024, or any other positive integer that is greater than one. Each of the storage elements 114-128 may be configured to be programmed to a threshold voltage indicating one or more logical bit values. It should be appreciated that the example of FIG. 1 is illustrative and that the non-volatile memory 104 may include a different number of and/or configuration of word lines, pages, and storage elements than shown in the particular example of FIG. 1.

The controller 140 may include an error correcting code (ECC) engine 142, digital logic 144, a random access memory (RAM) 146, and a host interface 160. The digital logic 144 may be dedicated circuitry configured to perform exclusive-or (XOR) operations. As another particular example, the digital logic 144 may include general purpose instructions associated with a general purpose instruction set architecture (ISA) and executable by a general purpose processing unit (e.g., a general purpose microcontroller). The RAM 146 may include a data buffer 150 configured to buffer data received from the host device 170 via the host interface 160. The RAM 146 may store other data useable by the controller 140. For example, the RAM 146 may store threshold data 148 indicating thresholds for reading data stored at storage elements of the non-volatile memory 104 (e.g., one or more of the storage elements 114-128), as described further with reference to FIG. 3. The digital logic 144 may include hardware, instructions (e.g., firmware), or a combination thereof.

The host device 170 may correspond to a mobile telephone, a music player, a video player, a gaming console, an electronic book reader, a personal digital assistant (PDA), a computer, such as a laptop computer or notebook computer, another electronic device, or a combination thereof. The host device 170 may communicate via a host controller, which may enable the host device 170 to read data from the non-volatile memory 104 and to write data to the non-volatile memory 104. The host device 170 may operate in compliance with a Joint Electron Devices Engineering Council (JEDEC) Solid State Technology Association industry specification, such as an embedded MultiMedia Card (eMMC) specification or a Universal Flash Storage (UFS) Host Controller Interface specification. The host device 170 may operate in compliance with one or more other specifications, such as a Secure Digital (SD) Host Controller specification as an illustrative example. The host device 170 may communicate with the non-volatile memory 104 in accordance with another suitable communication protocol.

In operation, the controller 140 may receive data and instructions from the host device 170 and may send data to the host device 170. The controller 140 may send data and commands to the non-volatile memory 104 and may receive data from the non-volatile memory 104. For example, the controller 140 is configured to send data and a write command to cause the non-volatile memory 104 to store the data to a specified address of the non-volatile memory 104. As another example, the controller 140 is configured to send a read command to read data from a specified address of the non-volatile memory 104. In the example of FIG. 1, the data buffer 150 stores data 152 and data 154 received from the host device 170 via the host interface 160. The data 152, 154 may be included in a file (e.g., an image, an audio file, a video file, a text document, etc.) to be stored at the non-volatile memory 104.

The ECC engine 142 may be configured to receive the data 152, 154 from the data buffer 150 and to generate a codeword based on the data. For example, the ECC engine 142 may include an encoder configured to encode data using an ECC encoding technique. The ECC engine 142 may include a Reed-Solomon encoder, a Bose-Chaudhuri-Hocquenghem (BCH) encoder, a low-density parity check (LDPC) encoder, a turbo encoder, an encoder configured to encode data according to one or more other ECC techniques, or a combination thereof. The ECC engine 142 may include a decoder configured to decode data read from the non-volatile memory 104 to detect and correct, up to an error correction capability of an ECC technique used by the ECC engine 142, bit errors that may be present in the data. In the example of FIG. 1, the ECC engine 142 may receive the data 152 and may generate a codeword 130 based on the data 152. The codeword 130 may be stored at the page 110. The codeword 130 may include bits $b^0_1 \ldots b^0_L$. The ECC engine 142 may be further configured to generate a codeword 132 based on the data 154. The codeword 132 may be stored at the page 112. The codeword 132 may include bits $b^1_1 \ldots b^1_L$.

In a particular embodiment, the codewords 130, 132 correspond to lower page data that is based on the data 152, 154. For example, in certain multi-level cell (MLC) architectures, lower page data (e.g., the first bit of a binary sequence representing data) is written to a word line (e.g., one of the word lines 106, 108) prior to writing upper page data (e.g., the second bit of the binary sequence) to the word line. In a particular configuration, lower page data is written sequentially to a pair of word lines followed by writing upper page data sequentially to the pair of word lines. If a write abort event (e.g., power failure) occurs while writing upper page data to a word line, the lower page data stored at the word line may be corrupted.

The controller 140 may generate parity information 136 based on lower page data in order to recover data corrupted by a write abort event. The parity information 136 may be stored at the parity storage portion 134. The parity information 136 may be generated based on the codewords 130, 132. For example, the parity information 136 may be generated based on a first bit of the codeword 130, a second bit of the codeword 130, a third bit of the codeword 132, and a fourth bit of the codeword 132. The parity information 136 may be generated using one or more logical operations, such as an exclusive-or (XOR) operation. The one or more logical operations may be performed by the digital logic 144. In a particular illustrative embodiment, the parity information 136 includes parity bits $p_0 \ldots p_{L/2}$, where $p_i = b^0_i \oplus b^0_{i+L/2} \oplus b^1_i \oplus b^1_{i+L/2}$, where i indicates an ith storage element of a word line for i=1, 2, ... L/2, where L indicates a number of storage elements in a word line, where L/2 indicates an offset between the ith storage element and the (i+L/2)th storage element, and where $\oplus$ indicates an XOR operation.

If a write abort event occurs while writing upper page data to one of the word lines 106, 108, one of the codewords 130, 132 may be corrupted and the other of the codewords 130, 132 may be uncorrupted. For example, if a write abort event occurs while writing upper page data to the word line 106 after the codeword 130 is written to the word line 106, the codeword 130 may be corrupted and the codeword 132 may be uncorrupted. As another example, if a write abort event occurs while writing upper page data to the word line 108 after the codeword 132 has been written to the word line 108, the codeword 132 may be corrupted and the codeword 130 may be uncorrupted. The write abort event may corrupt data beyond an error correcting capacity associated with a particular ECC technique used by the ECC engine 142 to encode the codewords 130, 132.

The parity information 136 may enable recovery of data corrupted by a write abort event using relatively few parity bits. For example, because a word line associated with a write abort event may contain both corrupted and uncorrupted data, the uncorrupted data can be utilized in connection with uncorrupted data of another word line to recover the corrupted data, reducing an amount of parity or "backup" data. As a particular example, if an ith bit of the codeword 130 is corrupted, the controller 140 may attempt to recover the ith bit of the codeword 130 using an (i+L/2)th bit of the codeword 130, an ith bit of the codeword 132, and an (i+L/2)th bit of the codeword 132, such as when the parity information 136 is generated according to $p_i = b^0_i \oplus b^0_{i+L/2} \oplus b^1_i \oplus b^1_{i+L/2}$, as explained in further detail with respect to FIG. 4. Alternatively, if both the ith bit of the codeword 130 and the (i+L/2)th bit of the codeword 130 are corrupted by the write abort event, one or more additional techniques may be performed by the controller 140, such as a decoding operation by the ECC engine 142, as described further below.

Figure 2:
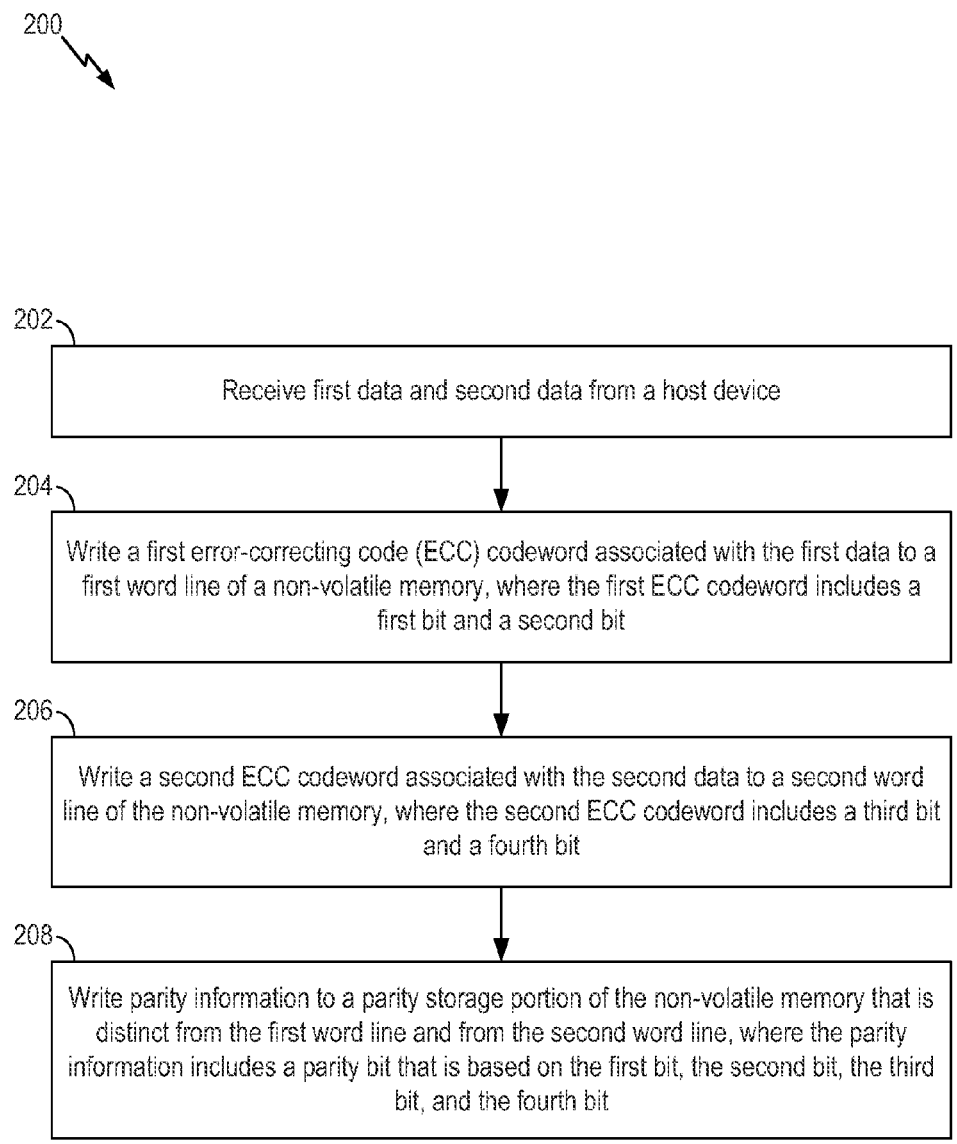
FIG. 2 is a flow diagram of a particular illustrative embodiment of an example method of operation of the data storage device of FIG. 1.

Referring to FIG. 2, a particular illustrative embodiment of a method is depicted and generally designated 200. The method 200 may be performed in the data storage device 102, such as by the controller 140. In a particular illustrative embodiment, a processing unit of the controller 140 of FIG. 1 executes general purpose instructions (e.g., instructions associated with a general purpose instruction set architecture) to perform one or more operations of the method 200 of FIG. 2.

The method 200 may include receiving first data and second data from a host device, at 202. The host device may correspond to the host device 170. The first data and the second data may correspond to the data 152, 154.

The method 200 may further include writing a first error-correcting code (ECC) codeword associated with the first data to a first word line of a non-volatile memory, at 204. The non-volatile memory may correspond to the non-volatile memory 104. The first ECC codeword may correspond to one of the codewords 130, 132. The first word line may correspond to one of the word lines 106, 108. The first ECC codeword may include a first bit and a second bit. For example, the first bit may be stored at an ith storage element of the first word line, and the second bit may be stored at an (i+L/2)th storage element of the first word line (i.e., the first bit may be offset from the second bit by L/2 storage elements of the first word line). L may indicate a number of storage elements of the first word line.

The method 200 may further include writing a second ECC codeword associated with the second data to a second word line of the non-volatile memory, at 206. The second ECC codeword may correspond to one of the codewords 130, 132. The second word line may correspond to one of the word lines 106, 108. The second ECC codeword may include a third bit and a fourth bit. For example, the third bit may be stored at an ith storage element of the second word line, and the fourth bit may be stored at an (i+L/2)th storage element of the second word line (i.e., the third bit may be offset from the fourth bit by L/2 storage elements of the second word line). L may indicate a number of storage elements of the first word line and a number of storage elements of the second word line.

The method 200 may further include writing parity information to a parity storage portion of the non-volatile memory that is distinct from the first word line and from the second word line, at 208. The parity information may correspond to the parity information 136. The parity storage portion may correspond to the parity storage portion 134. The parity information may include a parity bit that is based on the first bit, the second bit, the third bit, and the fourth bit. In a particular illustrative embodiment, the parity information includes a parity bit $p_i$, where $p_i = b^0_i \oplus b^0_{i+L/2} \oplus b^1_i \oplus b^1_{i+L/2}$. The parity information may include multiple parity bits, such as $p_1 \ldots p_{L/2}$, where $p_i = b^0_i \oplus b^0_{i+L/2} \oplus b^1_i \oplus b^1_{i+L/2}$.

The method 200 of FIG. 2 may enable recovery of data corrupted by a write abort event using fewer parity bits than techniques that store a full copy of lower page data or that store a bitwise XOR of first and second lower page data. For example, because a word line associated with a write abort event may contain both corrupted and uncorrupted data, the uncorrupted data can be utilized in connection with uncorrupted data of another word line to recover the corrupted data, reducing an amount of stored "backup" data. As a particular example, by XORing two lower pages together to generate a result and then XORing a first half of the result with a second half of the result, an amount of parity information is one-fourth an amount of backup data that would have been stored by another device that backs up each bit of the two lower pages. In a particular embodiment, if the parity information is insufficient to recover a corrupted bit (e.g., when two XORed bits of a lower page are both corrupted), the corrupted bit may be corrected using a decoding operation performed by the ECC engine 142, as described further below. Write abort events and effects of write abort events are described further with reference to FIG. 3. Recovery of data using parity information upon occurrence of a write abort event is described further with reference to FIGS. 4-8.

Figure 3:
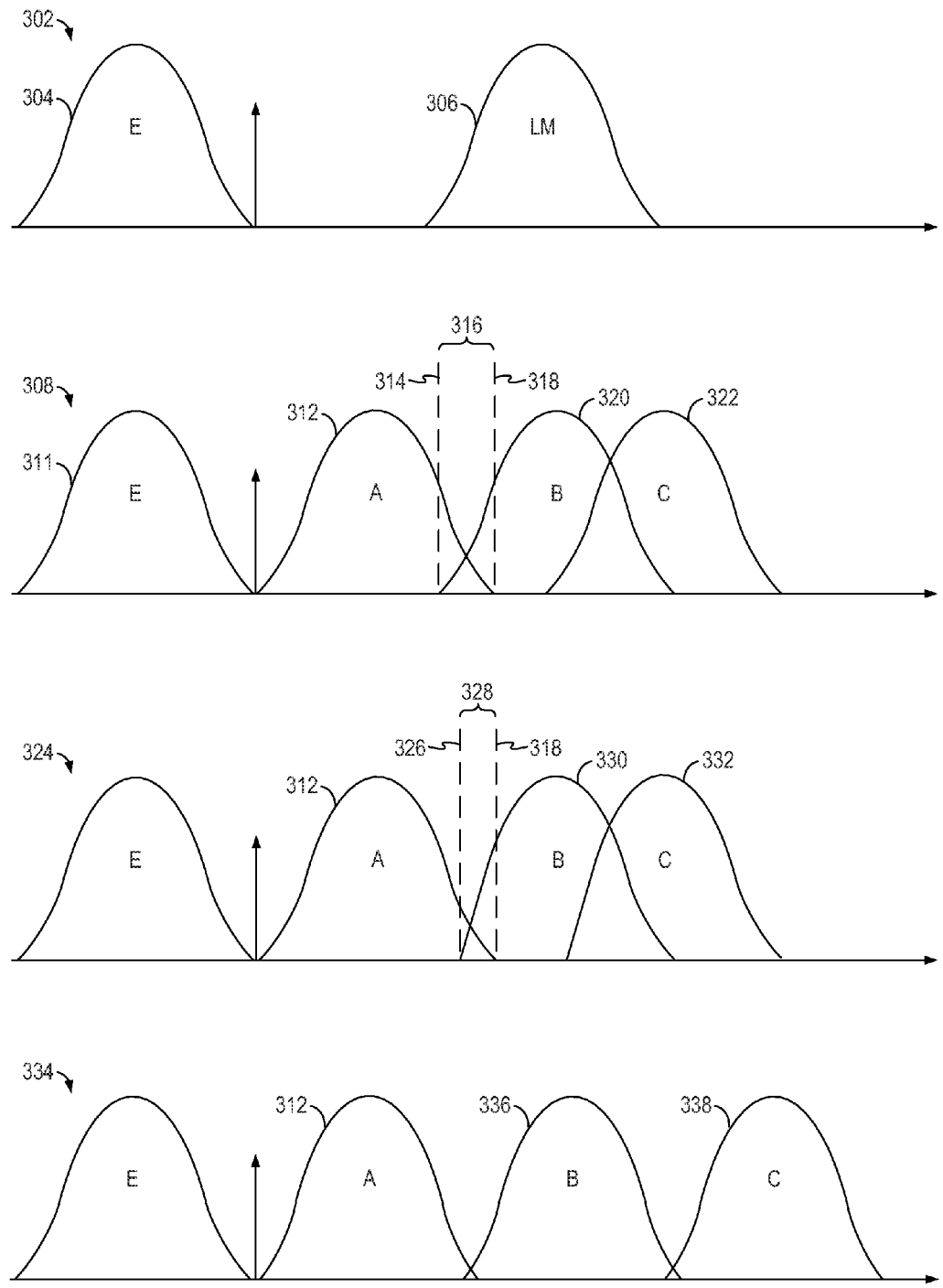
FIG. 3 is a diagram illustrating certain example threshold voltage distributions that represent data that can be stored, corrupted, and recovered at the data storage device of FIG. 1.

FIG. 3 is a diagram illustrating certain example threshold voltage distributions that represent data that can be stored, corrupted, and recovered at the data storage device 102. For example, FIG. 3 illustrates example histograms 302, 308, 324, and 334 indicating example threshold voltage distributions of storage elements showing states that represent data that can be stored, corrupted, and recovered at the data storage device 102. In FIG. 3, each abscissa may indicate threshold voltages of storage elements of the non-volatile memory 104, and each ordinate may indicate a number of storage elements of the non-volatile memory 104 having a particular threshold voltage. For example, the histograms 302, 308, 324, and 334 may indicate threshold voltage distributions of one or both of the word lines 106, 108.

The histogram 302 may include an erase state distribution 304 and an "LM" state distribution 306. The erase state distribution 304 may correspond to storage elements having a "1" lower page value and the "LM" state distribution 306 may correspond to storage elements having a "0" lower page value after lower page data is written and before writing upper page data associated with the lower page data.

The histogram 308 indicates distributions of thresholds after a write abort event occurs while writing upper page data. For example, the erase state distribution 304 has been "split" into an erase state distribution 311 and an "A" state distribution 312, and the "LM" state distribution 306 has been "moved" to a "B" state distribution 320 and a "C" state distribution 322. The erase state distribution 311 may correspond to a "11" value, the "A" state distribution 312 may correspond to a "01" value, the "B" state distribution 320 may correspond to a "00" value, and the "C" state distribution 322 may correspond to a "10" value, where the "1" in the "10" value corresponds to upper page data.

The distributions 312, 320 overlap due to the write abort event interrupting writing of the upper page data. For example, a region 316 is associated with an overlap of the "A" state distribution 312 and the "B" state distribution 320. As illustrated in the example of FIG. 3, a threshold 318 of the "A" state distribution 312 (e.g., a highest threshold voltage of storage elements corresponding to state "A") and a threshold 314 of the "B" state distribution 320 (e.g., a lowest threshold voltage of storage elements corresponds to state "B") may bound the region 316. Storage elements having threshold voltages falling within the region 316 may be considered corrupted by the write abort event.

The histogram 324 illustrates an alternative set of threshold voltage distributions after occurrence of a write abort event. The alternative distributions may result from an implementation of a modified programming signal that "tightens" the lower tail of the "LM" state distribution 306 (i.e., programs to higher threshold voltages). The modified programming signal may include a number of programming pulses, a duration of the programming pulses, a voltage of a verify pulse, or a combination thereof, that are calibrated to "tighten" lower tails of "B" and "C" state distributions so that, in case of a write abort event, a size of an overlap region between "A" and "B" states is reduced. For example, the modified programming signal may include a greater number of programming pulses, a lower duration of the programming pulses, and/or a higher voltage of a verify pulse as compared to a programming signal used to generate the distributions 311, 312, 320, 322 of the histogram 308.

The histogram 324 illustrates that a lower tail of a "B" state distribution 330 has been adjusted as compared to the "B" state distribution 320 of the histogram 308. As another example, the histogram 324 illustrates that a lower tail of a "C" state distribution 332 has been adjusted as compared to the "C" state distribution 322 of the histogram 308. Accordingly, a region 328 of overlap of the "A" state distribution 312 and the "B" state distribution 330 may be defined by a threshold 326 of the "B" state distribution 330 and a threshold 318 of the "A" state distribution 312. By adjusting the programming signal to tighten the distributions 330, 332, a size of the region 328 is less than a size of the region 316.

The histogram 334 illustrates a set of threshold voltage distributions after recovery of lower page data after a write abort event. For example, lower page data associated with one or both of the histograms 308, 324 may be recovered using one or more techniques described with reference to FIG. 1. Accordingly, overlap between the "A" state distribution 312, a "B" state distribution 336, and a "C" state distribution 338 is reduced as compared to the histograms 308, 324. The overlap between the distributions 312, 336, and 338 depicted in the example of FIG. 3 may be within an ECC capability of the ECC engine 142 such that the ECC engine 142 can decode one or more codewords that include data represented by one or more of the distributions 312, 336, and 338.

By adjusting a programming signal to reduce of size of the region 328 as compared to a size of the region 316, fewer bits may be corrupted by a write abort even (e.g., fewer bits may be associated with threshold voltages that fall within an "overlap" region, such as the region 328). The overlap can be controlled to reduce a bit error rate (BER) to within a threshold BER such that the ECC engine 142 is able to correct any bit errors that may remain after using the parity information 136 to correct one or more bits that are corrupted by the write abort event, as described further with reference to FIG. 4.

Figure 4:
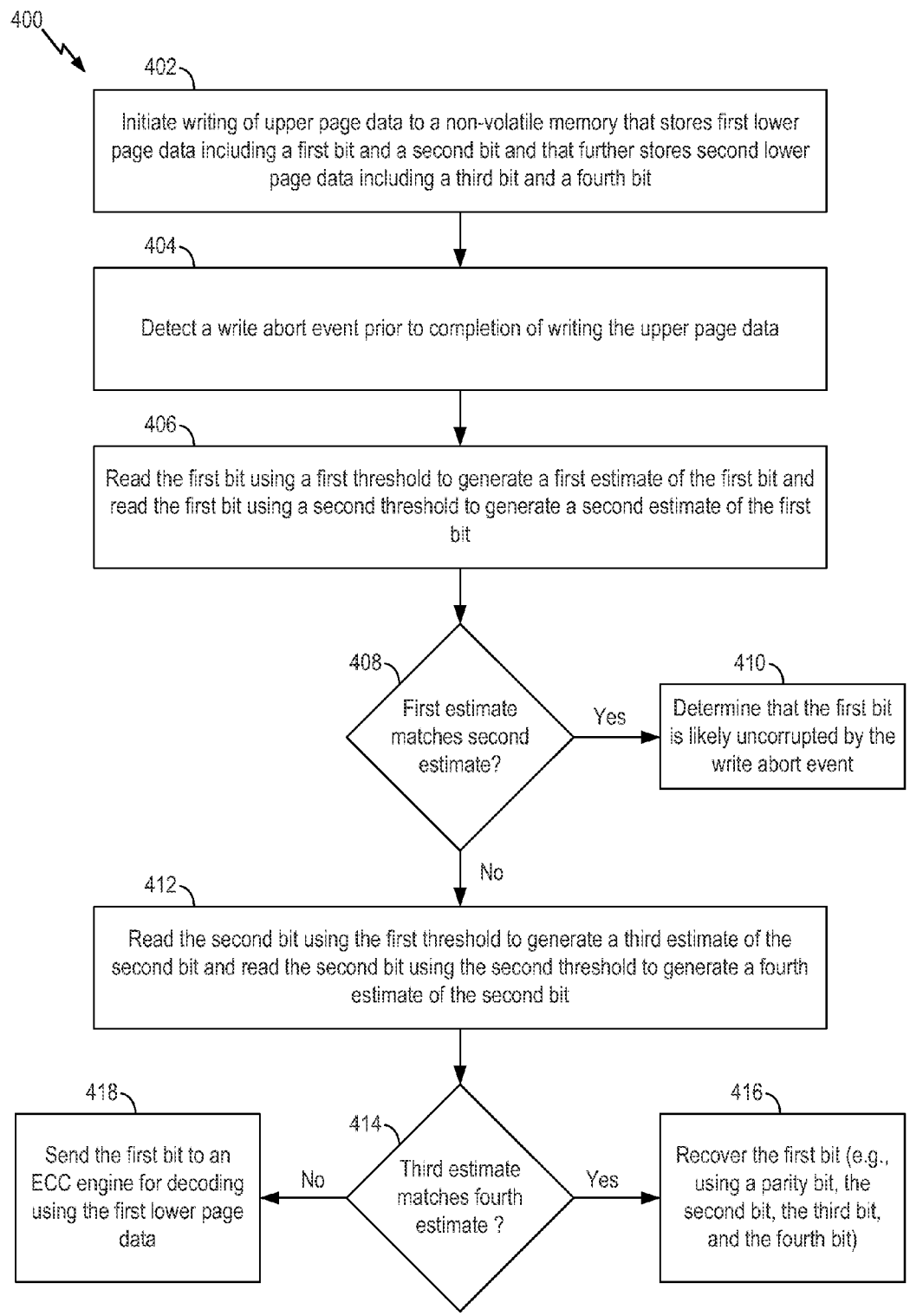
FIG. 4 is a flow diagram of another particular illustrative embodiment of an example method of operation of the data storage device of FIG. 1.

Referring to FIG. 4, a particular illustrative embodiment of a method is depicted and generally designated 400. The method 400 may be performed in the data storage device 102, such as by the controller 140. In a particular embodiment, the method 400 is performed using parity information generated using the method 200. The method 400 may be performed after performing the method 200.

The method 400 may include initiating writing of upper page data to a non-volatile memory that stores first lower page data and that further stores second lower page data, at 402. The non-volatile memory may correspond to the non-volatile memory 104. The first lower page data may include a first bit and a second bit. The second lower page data may include a third bit and a fourth bit. The first lower page data may correspond to the codeword 132. The first bit and the second bit may correspond to the bit $b^1_i$ and to the bit $b^1_{i+L/2}$, respectively. The second lower page data may correspond to the codeword 130. The third bit and the fourth bit may correspond to the bit $b^0_i$ and to the bit $b^0_{i+L/2}$, respectively.

The method 400 may further include detecting a write abort event prior to completion of writing the upper page data, at 404. The write abort event may correspond to a power down event, such as a power failure, an interrupt, such as an interrupt received from the host device 170, another event, or a combination thereof. The write abort event may corrupt data of the first lower page data or data of the second lower page data. For example, if the upper page data is written to a word line that stores the first lower page data, the write abort event may corrupt the first lower page data. After the write abort event, a distribution of threshold voltages at the word line may correspond to one of the histograms 308, 324.

The method 400 may further include reading the first bit using a first threshold to generate a first estimate of the first bit and reading the first bit using a second threshold to generate a second estimate of the first bit, at 406. Reading the first bit and reading the second bit may be performed in response to detecting the write abort event, such as to determine whether data of the first lower page has been corrupted by the write abort event. The first threshold and the second threshold may correspond to thresholds that are selected to enable determination of whether the first bit is in a region of uncertainty associated with overlap of states. For example, the first threshold and the second threshold may correspond to the thresholds 314, 318. As another example, the first threshold and the second threshold may correspond to the thresholds 318, 326 (e.g., if a programming signal has been adjusted prior to writing the upper page data, as described with reference to FIG. 3). The first estimate may be indicated by $l^1_i$, and the second estimate may be indicated by $r^1_i$.

The method 400 may further include determining whether the first estimate matches the second estimate, at 408. To illustrate, if the first bit is read using the thresholds 314, 318 and the first estimate and the second estimate each indicate that the first bit is associated with a threshold voltage that is less than the threshold 314, then the first estimate matches the second estimate. A determination may be made in this case that the first bit is likely a logical one bit. Further, if the first bit is read using the thresholds 314, 318 and the first estimate and the second estimate each indicate that the first bit is associated with a threshold voltage that is greater than the threshold 318, then the first estimate matches the second estimate. A determination may be made in this case that the first bit is likely a logical zero bit. If the first estimate matches the second estimate, then the method 400 may further include determining that the first bit is likely uncorrupted by the write abort event, at 410.

If the first estimate indicates that the first bit is associated with a threshold voltage that is greater than the threshold 314 and the second estimate indicates that the first bit is associated with a threshold voltage that is less than the threshold 318, then the first estimate does not match the second estimate. A determination may be made that the threshold voltage associated with the first bit is within the region 316. If the first estimate does not match the second estimate, then the method 400 may further include reading the second bit using the first threshold to generate a third estimate of the second bit and reading the second bit using the second threshold to generate a fourth estimate of the second bit, at 412.

The method 400 may further include determining whether the third estimate matches the fourth estimate, at 414. If the third estimate matches the fourth estimate (e.g., if the threshold voltage associated with the second bit is not within the region 316), then the method 400 may further include recovering the first bit, at 416. The first bit may be recovered using a parity bit, the second bit, the third bit, and the fourth bit. The parity bit may be included in the parity information 136. For example, the parity bit may correspond to $p_i$. In a particular illustrative embodiment, the first bit is recovered according to $b^1_i = r^1_{i+L/2} \oplus p_i \oplus b^0_i \oplus b^0_{i+L/2}$, where $b^1_i$ indicates the first bit, where $r^1_{i+L/2}$ indicates the third estimate, where $p_i$ indicates the parity bit, where $b^0_i$ indicates the second bit, where $b^0_i$ indicates the third bit, and where $b^0_{i+L/2}$ indicates the fourth bit. The third bit and the fourth bit may be recovered from the stored second lower page data, which may be uncorrupted by the write abort event. For example, in a configuration in which an upper page is written after writing two lower pages, occurrence of a write abort event while writing the upper page may corrupt one of the lower pages but not the other of the lower pages. Accordingly, techniques described herein enable data of the uncorrupted lower page to be used in connection with parity information to recover one or more bits of the corrupted lower page.

If the third estimate does not match the fourth estimate, the method 400 may further include sending the first bit (as part of a partially corrupted codeword) to an ECC engine, such as the ECC engine 142, for decoding using the first lower page data, at 418. In a particular embodiment, the first bit is assigned a bit value, since a reliable bit estimate of the first bit may not exist. In a particular illustrative embodiment, the first bit is assigned a bit value based on $b^1_i = \sim(r^1_{i+L/2} \oplus p_i \oplus b^0_i \oplus b^0_{i+L/2})$, where "~" indicates a logical negation (NOT) operation. In a particular embodiment, parity information described herein is sufficient to enable recovery of a sufficient number of corrupted bits such that the ECC engine 142 is operable to decode any remaining corrupted bits that are not recovered using the parity information. As a particular example, if the ECC engine is able to decode a codeword having a bit error rate (BER) of approximately 1 percent or less, and if a write abort event causes the codeword to have approximately a 10 percent BER, the parity information described herein may enable the controller 140 to recover enough corrupted bits to reduce the BER of the codeword from approximately 10 percent to approximately 1 percent or less. The ECC engine 142 may thereafter decode remaining corrupted bits of the codeword.

In a particular embodiment, a size of the region 316 can be adjusted to enable the parity information to correct a sufficient number of corrupted bits so that the ECC engine 142 can decode any remaining corrupted bits. For example, by adjusting the programming signal as described with reference to FIG. 3, the size of the region 316 can be reduced (e.g., to correspond to a size of the region 328). The size of the region 328 may be determined based on a particular error correction capability of the ECC engine 142, a type of encoding technique used by the ECC engine 142, a BER tolerance associated with a particular configuration of the data storage device 102, a BER tolerance associated with a particular application, one or more other factors, or a combination thereof, such as by calibrating a programming signal to modify a distribution "tail," as described with reference to FIG. 3. As a particular illustrative example, if a size of the region 316 corresponds to approximately 10 percent of the distributions 312, 320, then the probability of an "A" state threshold or a "B" state threshold falling within the region 316 is approximately 10 percent, and the probability of a pair of such thresholds falling within the region 316 is approximately 1 percent, which may be within the error correction capability of the ECC engine 142. Depending on the particular application, a size of the region 316 can be adjusted (e.g., to correspond to the region 328) by calibrating the programming signal so that the probability of a pair of thresholds falling within the region 316 does not exceed the error correction capability of the ECC engine 142 in case of a write abort event.

The techniques illustrated with respect to FIG. 4 may enable recovery of data corrupted by a write abort event. For example, corrupted lower page data can be recovered using parity information, such as by using the parity bit $p_i$ described above. As illustrated in FIG. 4, even if such parity information does not enable recovery of each corrupted bit of data, the parity information may be sufficient to reduce a BER of data to within a correctable amount (e.g., from 10 percent to within 1 percent). Accordingly, using one or more techniques described herein may enable recovery of corrupted data while using low overhead. As a particular example, an overhead (e.g., an amount of storage space) associated with a parity bit $p_i = b^0_i \oplus b^0_{i+L/2} \oplus b^1_i \oplus b^1_{i+L/2}$ may be one fourth an overhead associated with "backing up" of each of the bits $b^0_i$, $b^0_{i+L/2}$, $b^1_i$, and $b^1_{i+L/2}$.

The method 400 can be performed for each bit of data affected by a write abort event (e.g., for each bit of the codeword 132 if the write abort event occurs while writing upper page data to the word line 108). Alternatively, the method 400 can be performed for fewer than all (e.g., half) of the bits affected by a write abort event. For example, because the method 400 may determine reliability of both the first bit and the second bit (e.g., whether threshold voltages corresponding to the first bit and the second bit are within the region 316), the method 400 can be used to determine reliability of multiple bits that are potentially corrupted by a write abort event.

Figure 5:
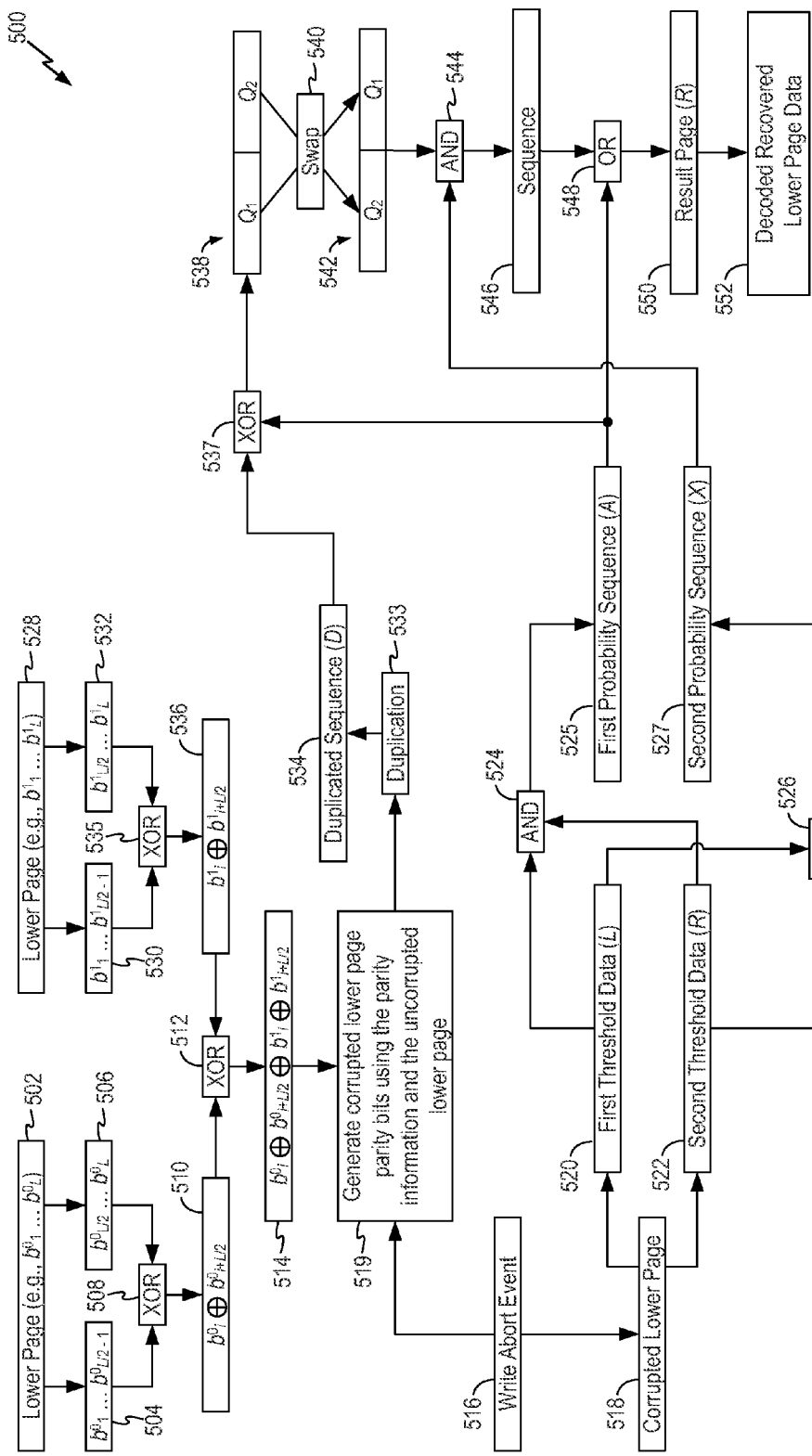
FIG. 5 is a data flow diagram illustrating operations that may be performed by the data storage device of FIG. 1.

FIG. 5 is a data flow diagram illustrating operations 500 that may be performed by the data storage device 102 of FIG. 1. In a particular embodiment, the operations 500 of FIG. 5 correspond to "sequence-level" data recovery in response to a write abort event. For example, while certain techniques described with reference to FIGS. 1-4 have been explained in terms of bit-by-bit operations for convenience of illustration, FIG. 5 illustrates particular examples in which operations can be performed on sequences of bits to recover corrupted data.

First lower page data may be received, at 502. The first lower page data may be received by the controller 140 from the host device 170. The first lower page data may correspond to the codeword 130. A first set of bits (e.g., a first half) of the first lower page data may be determined, at 504, and a second set of bits (e.g., a second half) of the first lower page data may be determined, at 506 (such as by "splitting" the first lower page data). An XOR operation may be performed using the first set of bits of the first lower page data and the second set of bits of the first lower page data, at 508, to generate first parity information, at 510. The XOR operation may be performed by the digital logic 144.

Second lower page data may be received, at 528. The second lower page data may be received by the controller 140 from the host device 170. The second lower page data may correspond to the codeword 132. A first set of bits (e.g., a first half) of the second lower page data may be determined, at 530, and a second set of bits (e.g., a second half) of the second lower page data may be determined, at 532 (such as by "splitting" the second lower page data). An XOR operation may be performed using the first set of bits of the second lower page data and the second set of bits of the second lower page data, at 535, to generate second parity information, at 536. The XOR operation may be performed by the digital logic 144.

An XOR operation may be performed using the first parity information and the second parity information, at 512, to generate parity information, at 514. The XOR operation may be performed by the digital logic 144. The parity information may correspond to the parity information 136. The parity information may be stored at the parity storage portion 134, such as prior to initiating writing of upper page data associated with the first lower page data and/or the second lower page data.

A write abort event may be detected, at 516. The write abort event may be detected while writing upper page data associated with the first lower page data or the second lower page data. The write abort event may corrupt one or more bits of the first lower page data or one or more bits of the second lower page data, generating a corrupted lower page, at 518. Because upper page data either has not yet been written or has previously been written successfully (e.g., without a write abort event) to a word line storing the other of the first lower page data and the second lower page data, the write abort event does not corrupt the other of the first lower page data and the second lower page data. Accordingly, after the write abort event, one of the first lower page data and the second lower page data may be corrupted and the other of the first lower page data and the second lower page data may be uncorrupted.

In response to the write abort event, parity bits corresponding to the corrupted lower page parity bits may be generated using the parity information and the uncorrupted lower page data, at 519. For example, because the parity information and the uncorrupted lower page data can be read and decoded, parity bits for the corrupted lower page can be generated or recovered, such as by performing an XOR operation between the first set of bits of the uncorrupted lower page and the second set of bits of the uncorrupted lower page data to generate a result, and by performing an XOR operation between the result and the parity information to generate the corrupted lower page parity bits. A duplication operation may be performed using the corrupted lower page parity bits, at 533, to generate a duplicated sequence, at 534. For example, two copies of the corrupted lower page parity bits may be concatenated. The duplication operation may be performed by the digital logic 144.

Data may be read from the corrupted lower page using a first threshold to generate first threshold data, at 520. The first threshold may correspond to the threshold 314 or the threshold 326. The first threshold data may include the first estimate of the first bit described with reference to FIG. 4, the third estimate of the second bit described with reference to FIG. 4, or a combination thereof.

Data may be read from the corrupted lower page using a second threshold to generate second threshold data, at 522. The second threshold may correspond to the threshold 318. The second threshold data may include the second estimate of the first bit described with reference to FIG. 4, the fourth estimate of the second bit described with reference to FIG. 4, or a combination thereof.

An AND operation may be performed using the first threshold data and the second threshold data, at 524, to generate a first probability sequence (e.g., a "high probability" sequence), at 525. The AND operation may be performed by the digital logic 144. An XOR operation may be performed using the first threshold data and the second threshold data, at 526, to generate a second probability sequence (e.g., a "confidence" sequence), at 527. The XOR operation may be performed by the digital logic 144.

An XOR operation may be performed using the duplicated sequence and the first probability sequence, at 537, to generate a parity sequence, at 538. The XOR operation may be performed by the digital logic 144. A swap operation may be performed, at 540, to generate a swapped parity sequence, at 542. For example, if the parity sequence includes a first portion $Q_1$ that precedes a second portion $Q_2$, the swap operation may reverse an order of the portions $Q_1$, $Q_2$ such that the swapped parity sequence includes the second portion $Q_2$ preceding the first portion $Q_1$. The swap operation may be performed by the digital logic 144.

An AND operation may be performed using the swapped parity sequence and the second probability sequence, at 544, to generate a sequence, at 546. The AND operation may be performed by the digital logic 144. An OR operation may be performed using the sequence and the first probability sequence, at 548, to generate a result page, at 550. The OR operation may be performed by the digital logic 144. The result page may be decoded to generate decoded recovered lower page data, at 552. For example, the result page may correspond to an ECC codeword (e.g., any of the codewords 130, 132) that is decodable by the ECC engine 142 to generate user data (e.g., any of the data 152, 154).

The operations 500 of FIG. 5 may enable sequence-wise operations to recover lower page data corrupted by a write abort event. Accordingly, corrupted data can be corrected quickly and efficiently (e.g., by performing operations in parallel and/or using bit-wise operations on sequences of information). In a particular embodiment, the operations 500 reduce backup data overhead by 87.5 percent as compared to a technique that backs up lower page data and upper page data.

Figure 6:
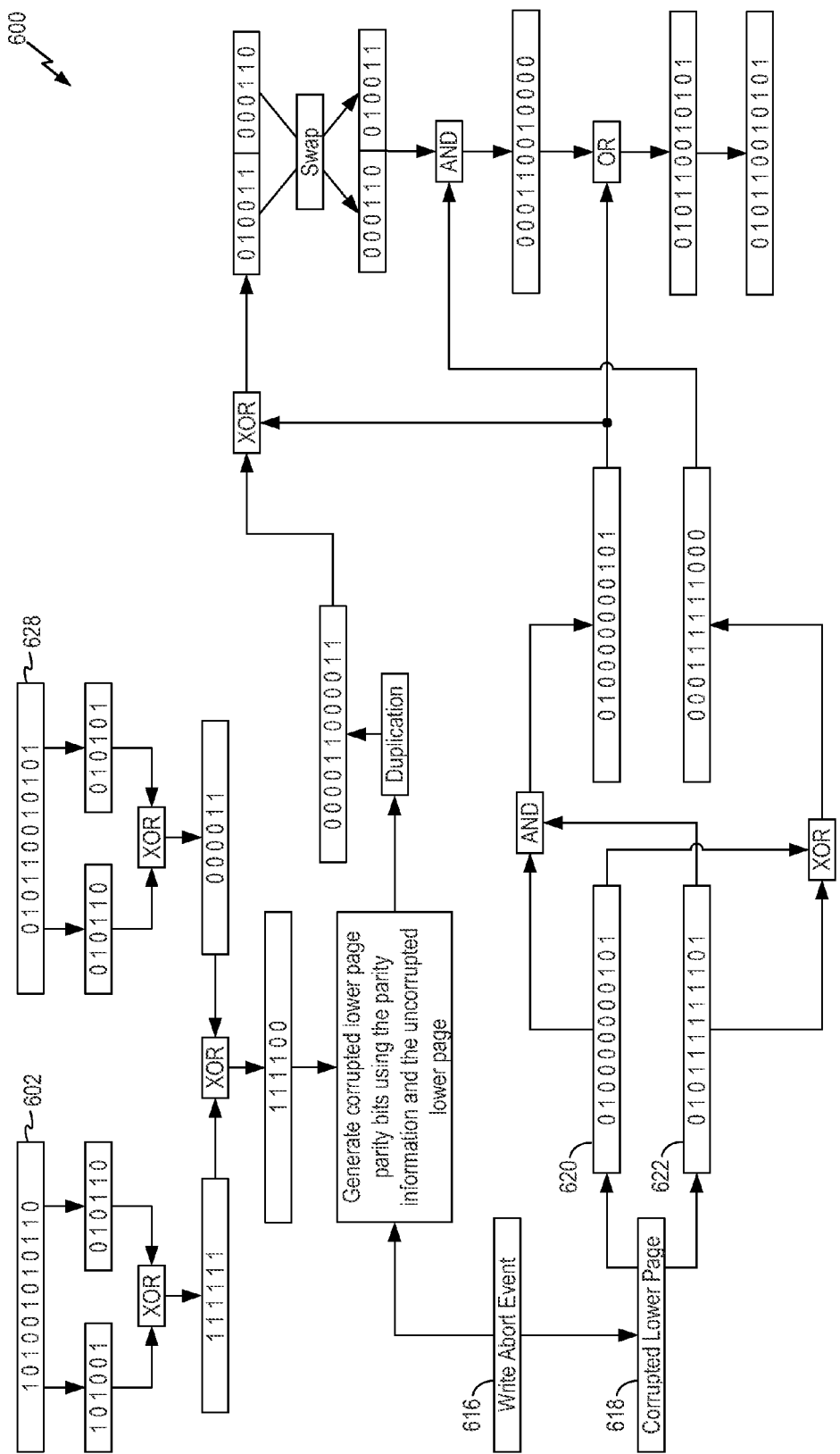
FIG. 6 depicts a particular example of the operations of FIG. 5.

FIG. 6 is a data flow diagram illustrating operations 600 that correspond to a particular example of the operations 500 of FIG. 5. In the particular example of FIG. 6, first lower page data including a first bit sequence ("1 0 1 0 0 1 0 1 0 1 1 0") is received, at 602, and second lower page data including a second bit sequence ("0 1 0 1 1 0 0 1 0 1 0 1") is received, at 628. Each bit of the first bit sequence and the second bit sequence may be assigned an index number i, where i is an integer selected from i=1, 2, ... L. Accordingly, for i=1, the ith bit of the first sequence is a "1" bit, and the ith bit of the second bit sequence is a "0" bit. In the particular example of FIG. 6, L=12, although in other implementations L may indicate a different number.

A write abort event may occur, at 616, corrupting one or more bits of the second lower page data to generate corrupted lower page data, at 618. The corrupted lower page data is read using a first threshold to generate first threshold data, at 620. The first threshold may correspond to the threshold 314 or the threshold 326. Data may be read from the corrupted lower page using a second threshold to generate second threshold data, at 622. The second threshold may correspond to the threshold 318. The first threshold data includes L bit estimates that are generated by reading the corrupted lower page data using the first threshold, and the second threshold data includes L bit estimates that are generated by reading the corrupted lower page data using the second threshold.

In the particular example of FIG. 6, at least one reliable bit estimate exists from among each ith bit estimate pair of the first threshold data and the second threshold data and each (i+L/2)th bit estimate pair of the first threshold data and the second threshold data for i=1, 2, ... L/2. To illustrate, for i=1, the ith bit estimate generated using the first threshold is "0," and the ith bit estimate generated using the second threshold is "0." Accordingly, the ith bit estimate pair is (0, 0). Therefore, the ith bit of the corrupted lower page data is read as "0" using both the first threshold and the second threshold, indicating a reliable (e.g., uncorrupted) bit. Referring again to FIG. 3, if the left and right thresholds respectively correspond to the thresholds 314, 318, then the ith bit may correspond to a threshold that is right of the region 316 (e.g., a "C" state threshold) because both the bit estimates indicate that the ith bit corresponds to a "0" bit (e.g., that the ith bit corresponds to a threshold that is greater than the threshold 314, such as a "C" state threshold).

Further, for i=1, the (i+L/2)th bit estimate generated using the first threshold is "0," and the (i+L/2)th bit estimate generated using the second threshold is "1." Accordingly, the (i+L/2)th bit estimate pair is (0, 1). Therefore, the (i+L/2)th bit of the corrupted lower page data is read as "0" using the first threshold, and the (i+L/2)th bit of the corrupted lower page data is read as "1" using the second threshold, indicating an unreliable (e.g., corrupted) bit. Referring again to FIG. 3, if the left and right thresholds respectively correspond to the thresholds 314, 318, then the (i+L/2)th bit may correspond to a threshold that is within the region 316 because the (i+L/2)th bit estimate generated using the first threshold indicates a threshold to the right of the threshold 314 and the (i+L/2)th bit estimate generated using the second threshold indicates a threshold to the left of the threshold 318.

Accordingly, for i=1, the ith bit estimate pair (0, 0) includes a reliable bit estimate (e.g., includes a pair of estimates that match), and the (i+L/2)th bit estimate pair (0, 1) includes an unreliable bit estimate (e.g., includes a pair of estimates that do not match). The ith bit is therefore likely uncorrupted, and the (i+L/2)th bit is likely corrupted (e.g., corresponds to a threshold that is within the region 316). The operations 600 enable recovery of the (i+L/2)th bit. In a particular embodiment, the (i+L/2)th bit is recovered using the parity information 136 of FIG. 1. For example, because a parity bit $p_i$ may be generated based on the ith bit and the (i+L/2)th bit of the first lower page data and further based on the ith bit and the (i+L/2)th bit of the second lower page data, the (i+L/2)th bit can be recovered. In a particular embodiment, the (i+L/2)th bit corresponds to $b^1_{i+L/2}$, and the (i+L/2)th bit is recovered using the equation $b^1_i \oplus b^1_{i+L/2} = p_i \oplus b^o_i \oplus b^o_{i+L/2}$, where $b^o_i$ and $b^o_{i+L/2}$ correspond to the ith bit and the (i+L/2)th bit of the uncorrupted lower page data, respectively.

FIG. 6 further indicates that at least one reliable bit estimate exists from among each ith bit estimate pair of the first threshold data and the second threshold data and each (i+L/2)th bit estimate pair of the first threshold data and the second threshold data for i=2, 3, ... L/2. To illustrate, for i=2, the ith bit estimate pair is (1, 1), and the (i+L/2)th bit estimate pair is (0, 1). For i=3, the ith bit estimate pair is (0, 0), and the (i+L/2)th bit estimate pair is (0, 1). For i=4, the ith bit estimate pair is (0, 1), and the (i+L/2)th bit estimate pair is (1, 1). For i=5, the ith bit estimate pair is (0, 1), and the (i+L/2)th bit estimate pair is (0, 0). For i=6, the ith bit estimate pair is (0, 1), and the (i+L/2)th bit estimate pair is (1, 1). Therefore, at least one reliable bit estimate exists from among each ith bit estimate pair of the first threshold data and the second threshold data and each (i+L/2)th bit estimate pair of the first threshold data and the second threshold data for i=1, 2, ... L/2.

The operations 600 of FIG. 6 may enable sequence-wise operations to recover lower page data corrupted by a write abort event. Accordingly, corrupted data can be corrected quickly and efficiently (e.g., by performing operations in parallel and/or using bit-wise operations on sequences of information).

Figure 7:
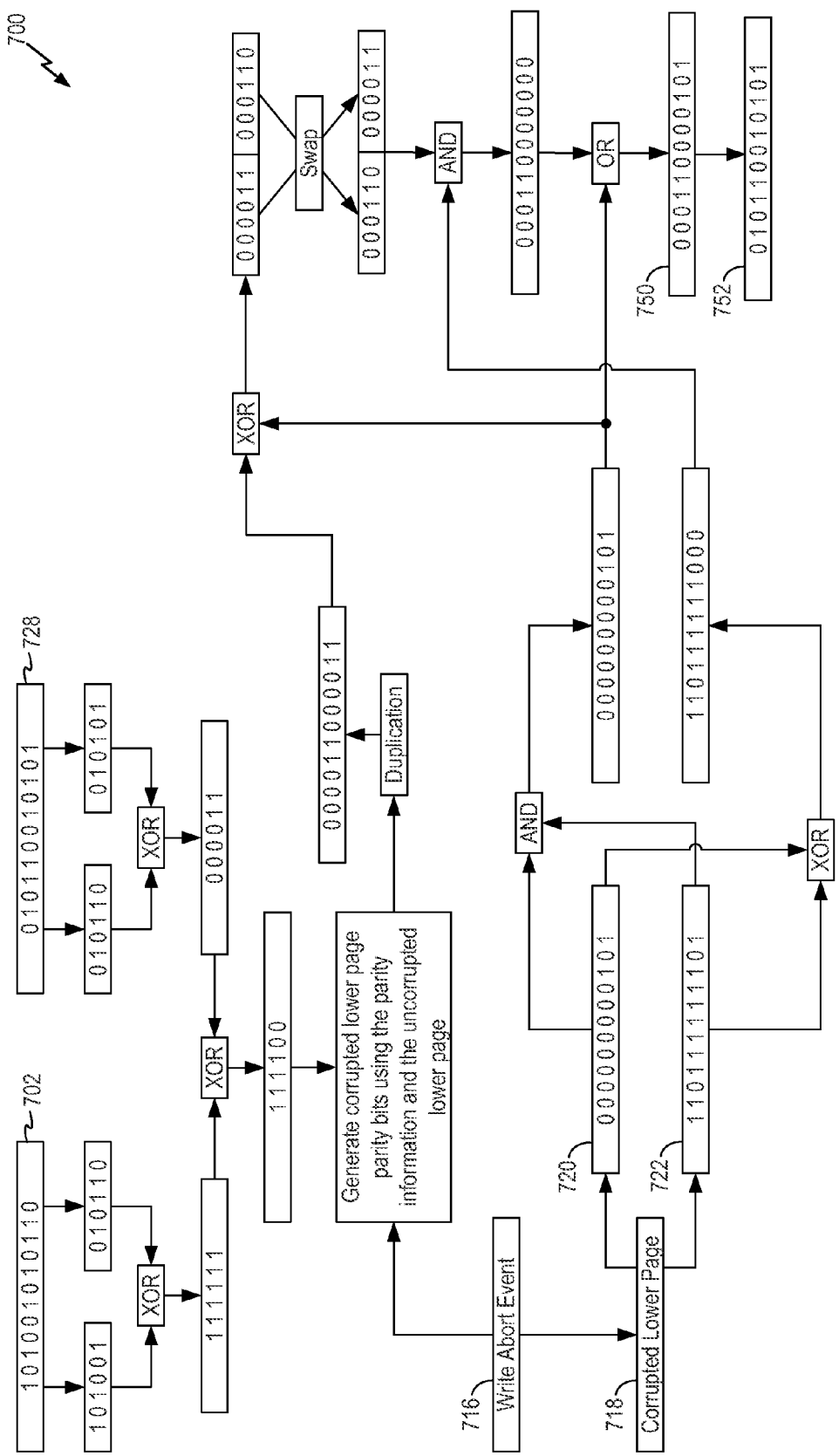
FIG. 7 depicts another particular example of the operations of FIG. 5.

FIG. 7 is a data flow diagram illustrating operations 700 that correspond to a particular example of the operations 500 of FIG. 5. In the particular example of FIG. 7, first lower page data including a first bit sequence ("1 0 1 0 0 1 0 1 0 1 1 0") is received, at 702, and second lower page data including a second bit sequence ("0 1 0 1 1 0 0 1 0 1 0 1") is received, at 728. Each bit of the first bit sequence and the second bit sequence may be assigned an index number i, where i is an integer selected from i=1, 2, ... L. Accordingly, for i=1, the ith bit of the first sequence is a "1" bit, and the ith bit of the second bit sequence is a "0" bit. In the particular example of FIG. 7, L=12, although in other implementations L may indicate a different number.

A write abort event may occur, at 716, corrupting one or more bits of the second lower page data to generate corrupted lower page data, at 718. The corrupted lower page data may be read using a first read threshold to generate first threshold data, at 720, and may be read using a second read threshold to generate second threshold data, at 722.

In the particular example of FIG. 7, the first threshold data and the second threshold data include two unreliable bit estimate pairs. To illustrate, for i=1, the ith bit estimate pair is (0, 1), and the (i+L/2)th bit estimate pair is (0, 1). Therefore, in the particular example of FIG. 7, the ith bit estimate pair and the (i+L/2)th bit estimate pair do not include a reliable bit estimate for i=1. Further, for i=2, the ith bit estimate pair is (0, 1), and the (i+L/2)th bit estimate pair is (0, 1). Therefore, in the particular example of FIG. 7, the ith bit estimate pair and the (i+L/2)th bit estimate pair do not include a reliable bit estimate for i=2.

Although the ith bit estimate pair and the (i+L/2)th bit estimate pair do not include a reliable bit estimate for i=1 and for i=2, other bits of the corrupted lower page data can be recovered. As an example, for i=3, although the (i+L/2)th bit estimate pair (0, 1) does not match, the ith bit estimate pair (0, 0) matches. Accordingly, for i=3, the (i+L/2)th bit can be recovered using the operations 700. As depicted in the particular example of FIG. 7, for i=3, 4, ... L/2, the ith bit estimate pair and the (i+L/2)th bit estimate pair include at least one "matching" bit estimate pair.

Therefore, although the ith bit estimate pair and the (i+L/2)th bit estimate pair do not include a reliable bit estimate for i=1 and for i=2, other bits of the corrupted lower page data can be recovered, thus reducing a bit error rate (BER) associated with the corrupted lower page data to within an error correction capability of the ECC engine 142. To illustrate, a result page may be generated, at 750. The result page includes two bit errors with respect to the second lower page data as originally written prior to the write abort event (i.e., the (i=2)th bit and the (i=8)th bit contain errors with respect to the second lower page data as originally written). The BER of the result page may be within an error correction capability of the ECC engine 142, resulting in decoded recovered lower page data, at 752. Therefore, the operations 700 of FIG. 7 enable recovery of lower page data by improving a BER of corrupted lower page data without requiring a backup of each bit of the lower page data, improving performance and increasing available storage space.

Figure 8:
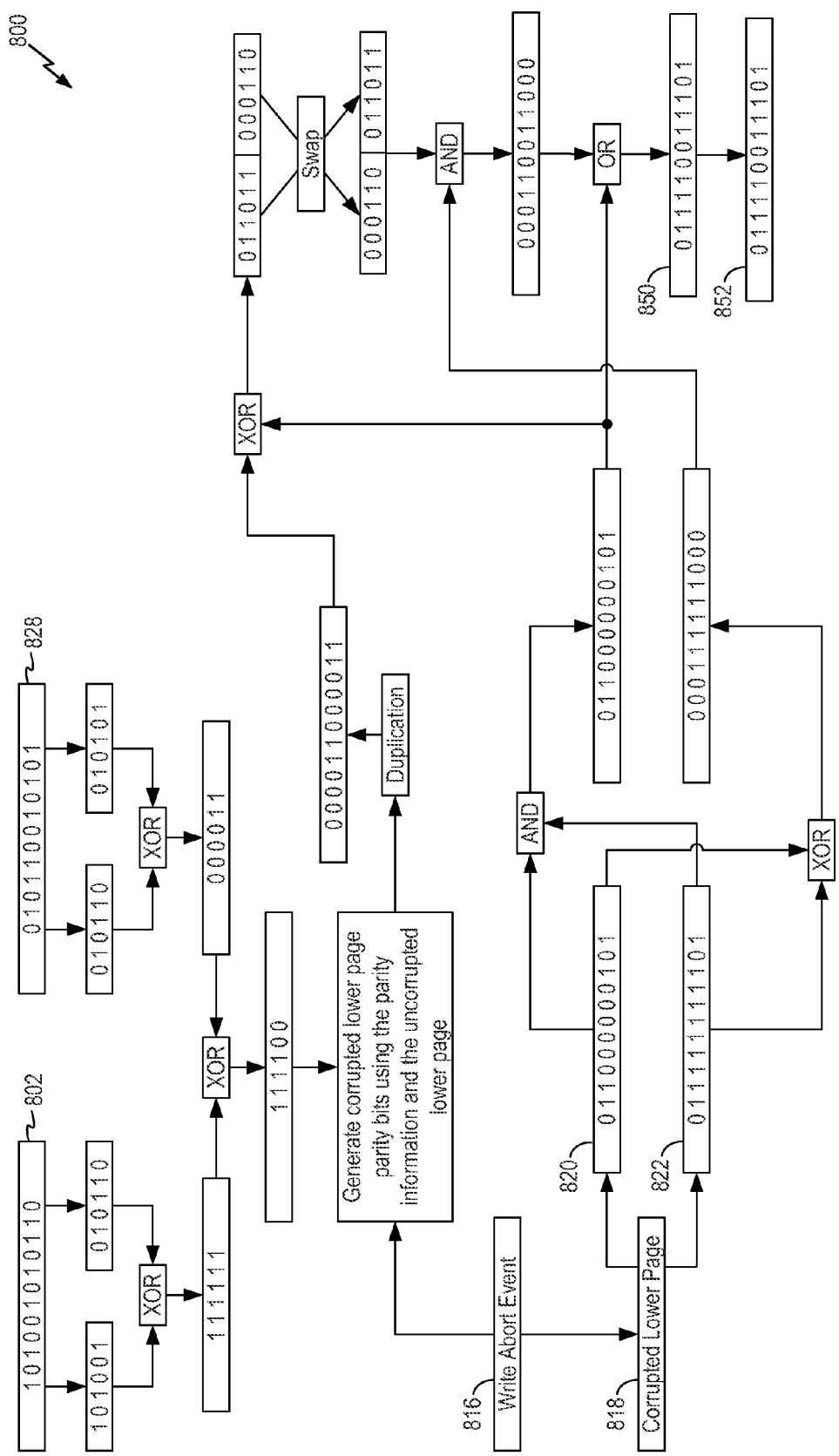
FIG. 8 depicts another particular example of the operations of FIG. 5.

FIG. 8 is a data flow diagram illustrating operations 800 that correspond to a particular example of the operations 500 of FIG. 5. In the particular example of FIG. 8, first lower page data including a first bit sequence ("1 0 1 0 0 1 0 1 0 1 1 0") is received, at 802, and second lower page data including a second bit sequence ("0 1 0 1 1 0 0 1 0 1 0 1") is received, at 828. Each bit of the first bit sequence and the second bit sequence may be assigned an index number i, where i is an integer selected from i=1, 2, ... L. Accordingly, for i=1, the ith bit of the first sequence is a "1" bit, and the ith bit of the second bit sequence is a "0" bit. In the particular example of FIG. 8, L=12, although in other implementations L may indicate a different number.

A write abort event may occur, at 816, corrupting one or more bits of the second lower page data to generate corrupted lower page data, at 818. The corrupted lower page data may be read using a first read threshold to generate first threshold data, at 820, and may be read using a second read threshold to generate second threshold data, at 822.

Depending on the particular implementation, one or both of the first threshold data and the second threshold data may include an "exception" bit that indicates the "wrong" value due to a "misaligned" read threshold. For example, the (i=3)th bit of the first threshold data ("1") may correspond to an exception bit. Referring again to FIG. 3, if the threshold 314 is used to read the (i=3)th bit of the first threshold data and the threshold 314 is misaligned to the right, the (i=3)th bit of the first threshold data may be read as a "1" using the threshold 314, even though the (i=3)th bit of the first threshold data is actually within the region 316.

To further illustrate, the controller 140 may be configured to determine the threshold data 148 using a full read threshold scan technique that iteratively scans the non-volatile memory 104 (or one or more word lines thereof) for threshold distribution "valleys." The threshold data 148 may indicate one or more of the thresholds 314, 318, 326. As a particular example, the controller 140 may scan the non-volatile memory 104 to determine the histogram 308. The controller 140 may determine a "valley" associated with the "A" state distribution 312 and the "B" state distribution 320, such as by locating a center of the region 316 (e.g., a "crossover" point between the distributions 312, 320). The center of the region 316 may correspond to a lowest threshold within the valley between the distributions 312, 320. The controller 140 may determine the threshold 318 by extrapolating the right tail of the "A" state distribution 312 from the crossover point to the threshold 318. For example, the right tail of the "A" state distribution 312 can be extrapolated based on the left tail of the "A" state distribution 312, by fitting the right tail to a Gaussian probability distribution function (e.g., using an estimated variance of the "A" state distribution 312 and/or using an estimated mean of the "A" state distribution 312), or a combination thereof. Alternatively or in addition, a read threshold can be determined based on one or more parameters used to program a particular distribution. For example, if a programming signal used to program the "B" state distribution 330 is calibrated (e.g., by adjusting a number of programming pulses, a duration of the programming pulses, and/or a voltage of a verify pulse), the left tail of the "B" state distribution 330 may extrapolated based on an estimated "tightening" of the left tail due to the calibration of the programming signal. Because extrapolating a distribution tail may be imprecise, one or more thresholds may be "misaligned," which may result in an "exception bit," such as the (i=3)th bit of the first threshold data in the example of FIG. 8.

If one or more exception bits cause failure of data recovery using parity information, the controller 140 may perform a "heroic" recovery technique. For example, the heroic recovery technique may be performed if a result page generated at 850 contains too many errors (e.g., exception bits) to decode the result page to generate decoded recovered lower page data, at 852. Performing the heroic recovery technique may include adjusting (e.g., expanding and/or reducing) an estimated size of an overlap region between distributions (e.g., one or more of the regions 316, 328) to "realign" one or more of the left and right thresholds (e.g., to realign one or more of the thresholds 314, 318, 326). After adjusting the estimated size of the overlap region, the corrupted lower page data can be re-read using the realigned left and right thresholds. As a particular example, if the (i=3)th bit of the first threshold data corresponds to an exception bit that is misread as a "1" bit using the threshold 314, the size of the region 316 may be adjusted by realigning the threshold 314. If the threshold 314 is sufficiently realigned to the left, reading the (i=3)th bit of the first threshold data may result in a "0" bit, correcting the exception bit. Alternatively or in addition, the size of the overlap region may be maintained while both thresholds are realigned. For example, a size of the region 316 may be maintained while both of the thresholds 314, 318 are realigned leftward or rightward.

Accordingly, the result page of FIG. 8 includes exception errors (i.e., the (i=3)th bit and the (i=9)th bit of the result page) caused by the exception bit. A bit error rate (BER) of the result page may be within an error correction capability of the ECC engine 142, resulting in decoded recovered lower page data, at 852. If the BER of the result page exceeds the error correction capability of the ECC engine 142, one or more heroic recovery techniques may be performed to correct one or more exception errors, bringing the BER of the result page within the error correction capability of the ECC engine 142. Therefore, the operations 800 of FIG. 8 enable recovery of lower page data by improving a BER of corrupted lower page data without requiring a backup of each bit of the lower page data, improving performance and increasing available storage space.

The foregoing description is intended to be illustrative and non-limiting. For example, although particular example ECC error correction capabilities with extended parity have been described herein as ten percent or as approximately ten percent, an ECC correction capability may depend on the particular application and/or the particular ECC technique used. For example, in a particular configuration that uses a particular 77-bit BCH encoding technique with a codeword size of 16 kilobits (kb), a size of the region 328 may be calibrated to not exceed seven percent of the distributions 312, 330. As another example, in a particular configuration that uses a particular 128-bit BCH encoding technique with a codeword size of 16 kb, a size of the region 328 may be calibrated to not exceed nine percent of the distributions 312, 330. As another example, in a particular configuration that uses a particular "one percent correction" LDPC encoding technique with a codeword size of 32 kb, a size of the region 328 may be calibrated to not exceed ten percent of the distributions 312, 330. Such configurations are provided for illustrative purposes and are not intended to limit the scope of the appended claims.

Although one or more components depicted herein are illustrated as block components and described in general terms, such components may include one or more microprocessors, state machines, or other circuits configured to enable the controller 140 (or one or more components thereof) to perform operations described herein. For example, the digital logic 144 may correspond to one or more physical components, such as hardware controllers, state machines, logic circuits, one or more other structures, or a combination thereof, to enable the controller 140 to perform one or more operations described herein.

To further illustrate, the controller 140 may be configured to write a first ECC codeword to the word line 106 of the non-volatile memory 104, such as by receiving the data 152, providing the data 152 to an input of the ECC engine 142, and by sending a control signal to the ECC engine 142 that causes the ECC engine 142 to encode the data 152 to generate the codeword 130 and to send the codeword 130 to the non-volatile memory 104 to be stored at the word line 106. The controller 140 may be further configured to write a second ECC codeword to the word line 108 of the non-volatile memory 104, such as by receiving the data 154, providing the data 154 to the input of the ECC engine 142 and by sending a control signal to the ECC engine 142 that causes the ECC engine 142 to encode the data 154 to generate the codeword 132 and to send the codeword 132 to the non-volatile memory 104 to be stored at the word line 108. The first ECC codeword includes a first bit and a second bit, and the second ECC codeword includes a third bit and a fourth bit. The bits may be generated upon receiving the data 152, 154 at the input of the ECC engine 142 based on a particular encoding technique used by the ECC engine 142. The controller 140 may be further configured to write parity information to a parity storage portion of the non-volatile memory that is distinct from the first word line and from the second word line. For example, the controller 140 may send the codewords 130, 132 to the digital logic 144, and the digital logic 144 may generate the parity information based on the first bit, the second bit, the third bit, and the fourth bit (e.g., by performing a first XOR operation of the first bit and the second bit to generate a first result, performing a second XOR operation of the third bit and the fourth bit to generate a second result, and performing a third XOR operation of the first result and the second result). The first bit and the second bit may be offset by an offset amount L/2, and the third bit and the fourth bit may be offset by the offset amount L/2, where L corresponds to a length of the first ECC codeword and the second ECC codeword. The digital logic 144 may output a parity bit to be stored at the parity storage portion 134 by the controller 140. The controller 140 may issue a write command to write the parity bit to the parity storage portion 134. The parity bit is based on the first bit, the second bit, the third bit, the fourth bit. For example, the parity bit may correspond to $p_i$, where $p_i = b^0_i \oplus b^0_{i+L/2} \oplus b^1_i \oplus b^1_{i+L/2}$.

One or more aspects of the controller 140 may be implemented using a microprocessor or microcontroller programmed to perform operations described herein, such as operations corresponding to the methods 200 and 400 of FIGS. 2 and 4. In a particular embodiment, the controller 140 includes a processor executing instructions that are stored at the non-volatile memory 104. Alternatively or in addition, executable instructions that are executed by the processor may be stored at a separate memory location that is not part of the non-volatile memory 104, such as at a read-only memory (ROM). As a particular example, certain operations of the method 400 of FIG. 4 may be implemented using instructions corresponding to the following illustrative pseudo-code:

if ($l^1_i == r^1_i$)

$b^1_i = r^1_i$;

else if ($r^1_{i+L/2} == l^1_{i+L/2}$)

$b^1_i = r^1_{i+L/2} \oplus p_i \oplus b^0_i \oplus b^0_{i+L/2}$;

else $b^1_i = \sim(r^1_{i+L/2} \oplus p_i \oplus b^0_i \oplus b^0_{i+L/2})$;

In a particular embodiment, the data storage device 102 may be attached to or embedded within one or more host devices, such as within a housing of a host communication device, which may correspond to the host device 170. For example, the data storage device 102 may be integrated within a packaged apparatus such as a wireless telephone, a personal digital assistant (PDA), a gaming device or console, a portable navigation device, or other device that uses internal non-volatile memory. However, in other embodiments, the data storage device 102 may be implemented in a portable device configured to be selectively coupled to one or more external devices, such as the host device 170. In a particular embodiment, the data storage device 102 may be coupled to a non-volatile memory, such as a three-dimensional (3D) memory, a flash memory (e.g., NAND, NOR, multi-level cell (MLC)), a divided bit-line NOR (DINOR) memory, an AND memory, a high capacitive coupling ratio (HiCR) device, an asymmetrical contactless transistor (ACT) device, or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device including a non-volatile memory and a controller, performing by the controller:
receiving first data and second data from a host device;
writing a first error-correcting code (ECC) codeword associated with the first data to a first word line of the non-volatile memory, wherein the first ECC codeword includes a first bit and a second bit;
writing a second ECC codeword associated with the second data to a second word line of the non-volatile memory, wherein the second ECC codeword includes a third bit and a fourth bit;
writing parity information to a parity storage portion of the non-volatile memory that is distinct from the first word line and from the second word line, wherein the parity information includes a parity bit that is based on the first bit, the second bit, the third bit, and the fourth bit; and
in response to occurrence of a write abort event:
reading the first bit using a first threshold to generate a first estimate of the first bit; and
reading the first bit using a second threshold to generate a second estimate of the first bit.

2. The method of claim 1, wherein the first ECC codeword corresponds to lower page data written to a multi-level cell (MLC) portion of the non-volatile memory, and wherein the parity storage portion corresponds to a single-level cell (SLC) portion of the non-volatile memory.

3. The method of claim 1, further comprising:
determining whether the first estimate matches the second estimate; and
in response to determining that the first estimate matches the second estimate, determining that the first bit is likely to be uncorrupted by the write abort event.

4. The method of claim 1, further comprising:
reading the second bit using the first threshold to generate a third estimate of the second bit and reading the second bit using the second threshold to generate a fourth estimate of the second bit; and
determining whether the third estimate matches the fourth estimate.

5. The method of claim 4, further comprising in response to determining that the first estimate does not match the second estimate, recovering the first bit using the parity bit in response to determining that the third estimate matches the fourth estimate.

6. The method of claim 5, wherein the first bit is recovered using the parity bit, the second bit, the third bit, and the fourth bit.

7. The method of claim 4, further comprising sending the first ECC codeword to an ECC engine in response to determining that the first estimate does not match the second estimate and that the third estimate does not match the fourth estimate.

8. The method of claim 1, wherein the parity bit is further based on a first result of a first operation based on the first bit and the second bit and is further based on a second result of a second operation based on the third bit and the fourth bit.

9. The method of claim 8, wherein the parity bit is generated based on a third operation based on the first result and the second result, and wherein the first operation, the second operation, and the third operation correspond to an exclusive-or (XOR) operation.

10. The method of claim 1, wherein the second bit is selected based on an offset between a first storage element of the first word line that stores the first bit and a second storage element of the first word line that stores the second bit.

11. The method of claim 10, wherein L indicates a number of storage elements of the first word line, wherein L is an integer that is greater than one, and wherein the offset corresponds to L/2.

12. The method of claim 1, wherein the data storage device is embedded within the host device.

13. A data storage device comprising:
a non-volatile memory; and
a controller coupled to the non-volatile memory, wherein the controller is configured to:
receive first data and second data from a host device;
write a first error-correcting code (ECC) codeword associated with the first data to a first word line of the non-volatile memory, wherein the first ECC codeword includes a first bit and a second bit;
read the first bit using a first threshold to generate a first estimate of the first bit;
read the first bit using a second threshold to generate a second estimate of the first bit in response to an occurrence of a write abort event;
write a second ECC codeword associated with the second data to a second word line of the non-volatile memory, wherein the second ECC codeword includes a third bit and a fourth bit; and
write parity information to a parity storage portion of the non-volatile memory, wherein the parity storage portion is distinct from the first word line and from the second word line, and wherein the parity information includes a parity bit that is based on the first bit, the second bit, the third bit, and the fourth bit.

14. The data storage device of claim 13, wherein the first ECC codeword corresponds to lower page data written to a multi-level cell (MLC) portion of the non-volatile memory, and wherein the parity storage portion corresponds to a single-level cell (SLC) portion of the non-volatile memory.

15. The data storage device of claim 13, wherein the controller is further configured to determine whether the first estimate matches the second estimate and to determine that the first bit is likely to be uncorrupted by the write abort event in response to the first estimate matching the second estimate.

16. The data storage device of claim 13, wherein the controller is further configured to read the second bit using the first threshold to generate a third estimate of the second bit and to read the second bit using the second threshold to generate a fourth estimate of the second bit.

17. The data storage device of claim 16, wherein the controller is further configured to recover the first bit using the parity bit in response to determining that the third estimate matches the fourth estimate and in response to determining that the first estimate does not match the second estimate.

18. The data storage device of claim 17, wherein the controller further includes an ECC engine, and wherein the controller is farther configured to send the first ECC codeword to the ECC engine in response to determining that the first estimate does not match the second estimate and flint the third estimate does not match the fourth estimate.

19. The data storage device of claim 13, wherein the controller is embedded within the host device.

20. The data storage device of claim 13, wherein the parity bit is further based on a first result of a first operation based on the first bit and the second bit and is further based on a second result of a second operation based on the third bit and the fourth bit.

* * * * *